United States Patent
Otremba

(10) Patent No.: US 9,589,904 B2
(45) Date of Patent: Mar. 7, 2017

(54) SEMICONDUCTOR DEVICE WITH BYPASS FUNCTIONALITY AND METHOD THEREOF

(71) Applicant: Infineon Technologies Austria AG, Villach (AT)

(72) Inventor: Ralf Otremba, Kaufbeuren (DE)

(73) Assignee: Infineon Technologies Austria AG, Villach (AT)

( * ) Notice: Subject to any disclaimer, the term of this patent is extended or adjusted under 35 U.S.C. 154(b) by 620 days.

(21) Appl. No.: 13/767,668

(22) Filed: Feb. 14, 2013

(65) Prior Publication Data
US 2014/0225661 A1 Aug. 14, 2014

(51) Int. Cl.
| | |
|---|---|
| H01L 23/02 | (2006.01) |
| H01L 23/552 | (2006.01) |
| G05F 3/02 | (2006.01) |
| H01L 21/50 | (2006.01) |
| H01L 23/34 | (2006.01) |
| H01L 23/495 | (2006.01) |
| H01L 23/36 | (2006.01) |
| H01L 23/492 | (2006.01) |
| H01L 23/62 | (2006.01) |
| H01L 23/31 | (2006.01) |

(52) U.S. Cl.
CPC ............... *H01L 23/552* (2013.01); *G05F 3/02* (2013.01); *H01L 21/50* (2013.01); *H01L 23/34* (2013.01); *H01L 23/36* (2013.01); *H01L 23/492* (2013.01); *H01L 23/495* (2013.01); *H01L 23/49562* (2013.01); *H01L 23/62* (2013.01); *H01L 23/3107* (2013.01); *H01L 2224/48247* (2013.01); *H01L 2224/4903* (2013.01); *H01L 2924/1301* (2013.01); *H01L 2924/1305* (2013.01); *H01L 2924/13055* (2013.01); *H01L 2924/13062* (2013.01); *H01L 2924/13091* (2013.01)

(58) Field of Classification Search
CPC ............... H01L 2924/00; H01L 27/142; H01L 2924/10253; H01L 2924/13055; H01L 2924/13062
USPC ........ 327/175, 530; 257/678, 701, 288, 107, 257/173
See application file for complete search history.

(56) References Cited

U.S. PATENT DOCUMENTS

| | | | |
|---|---|---|---|
| 6,100,745 A | 8/2000 | Dougherty | |
| 6,194,651 B1 | 2/2001 | Stark et al. | |
| 6,348,808 B1 * | 2/2002 | Yakura | G01R 31/2858 324/750.3 |
| 6,849,479 B2 | 2/2005 | Wu | |
| 7,477,013 B2 * | 1/2009 | Yu | H01L 27/3239 313/504 |
| 7,985,983 B2 | 7/2011 | Russ et al. | |

(Continued)

FOREIGN PATENT DOCUMENTS

| | | |
|---|---|---|
| CN | 1518133 A | 8/2004 |
| CN | 201435388 Y | 3/2010 |

(Continued)

*Primary Examiner* — Lincoln Donovan
*Assistant Examiner* — Diana J Cheng
(74) *Attorney, Agent, or Firm* — Slater Matsil, LLP

(57) ABSTRACT

A device includes a semiconductor chip and a bypass layer electrically coupled to a contact region of the semiconductor chip. The bypass layer is configured to change from behaving as an insulator to behaving as a conductor in response to a condition of the semiconductor chip.

29 Claims, 6 Drawing Sheets

(56) References Cited

U.S. PATENT DOCUMENTS

2009/0279220 A1\* 11/2009 Hauenstein et al. ............ 361/57
2011/0043141 A1 2/2011 Kim et al.

FOREIGN PATENT DOCUMENTS

| CN | 101814488 A | 8/2010 |
|----|-------------|--------|
| WO | 2007142423 A1 | 12/2007 |

\* cited by examiner

SEMICONDUCTOR DEVICE WITH BYPASS FUNCTIONALITY AND METHOD THEREOF

TECHNICAL FIELD

The present invention relates generally to semiconductor devices with bypass functionality and, in particular embodiments, to power semiconductor devices with bypass functionality. Moreover, embodiments of the present invention relate to methods of making semiconductor devices or power semiconductor devices.

BACKGROUND

Semiconductor devices are used in a variety of electronic and other applications. Semiconductor devices comprise integrated circuits or discrete devices that are formed on semiconductor wafers by depositing one or more types of thin films of material over the semiconductor wafers, and patterning the thin films of material to form the integrated circuits.

The semiconductor devices are typically packaged within a ceramic or a plastic body to protect the semiconductor devices from physical damage or corrosion. The packaging also supports the electrical contacts required to connect a semiconductor device, also referred to as a die or a chip, to other devices external to the packaging.

Packaging may also support the thermal cooling requirements of the devices. Conventional packaging may not provide sufficient thermal protection when the semiconductor devices generate large amounts of heat.

SUMMARY OF THE INVENTION

In accordance with an embodiment of the present invention, a device comprises a semiconductor chip and a bypass layer electrically coupled to a contact region of the semiconductor chip, the bypass layer configured to change from behaving as an insulator to behaving as a conductor in response to a condition of the semiconductor chip.

In accordance with an embodiment of the present invention, a device comprises a chip carrier, a chip disposed on a first surface of the chip carrier and a bypass layer disposed on a second surface of the chip carrier so that the chip carrier is disposed between the bypass layer and the chip, wherein the bypass layer is configured to change from behaving as an insulator to behaving as a conductor in response to a condition of the chip.

In accordance with an embodiment of the present invention, a power MOSFET device comprises a power MOSFET chip comprising a source terminal at a first surface of the chip, a gate terminal at the first surface of the chip, and a drain terminal at a second surface of the chip, the second surface opposite the first surface and a lead having a die pad, a source lead, a gate lead and a drain lead that is electrically coupled to the die pad, wherein the chip is mounted on a first surface of the die pad and wherein the source terminal of the chip is electrically coupled to the source lead, the gate terminal of the chip is electrically coupled to the gate lead and the drain terminal of the chip is electrically coupled to the drain lead. The power MOSFET further comprises a bypass layer disposed on a second surface of the die pad so that the die pad is disposed between the bypass layer and the chip, wherein the bypass layer is configured to change from behaving as an insulator to behaving as a conductor in response to a condition of the chip.

In accordance with an embodiment of the present invention, a method for manufacturing a semiconductor device comprises providing a semiconductor chip and electrically coupling a bypass layer to a contact region of the semiconductor chip, the bypass layer comprising a material configured to change from behaving as an insulator to behaving as a conductor in response to a condition of the semiconductor chip.

In accordance with an embodiment of the present invention, a method of operating a semiconductor device that comprises a semiconductor chip having first and second contact regions and a bypass layer electrically coupled to the first contact region, comprises during a normal mode of operation, conducting a current through the semiconductor chip between the first contact region and the second contact region, wherein the bypass layer is electrically insulating during the normal mode of operation and during an overstress mode of operation, conducting the current through the bypass layer away from the semiconductor chip, wherein the bypass layer has a lower resistance during the overstress mode of operation than during the normal mode of operation.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a power semiconductor device comprising a bypass functionality. The invention may also be applied, however, to other semiconductor devices or to devices comprising materials other than semiconductor materials.

In some high energy applications (HEA) some failure modes must be completely avoided due to the disastrous impact on the high energy systems. One such failure mode is an open contact within a power semiconductor device. Therefore separate bypass devices are required in some high energy applications to take over the current flow if an open contact occurs. These separate bypass devices are relatively complex to be designed and increase the overall system cost.

Embodiments of the invention provide a packaged semiconductor chip with bypass functionality. Further embodiments provide a packaged power semiconductor chip with integrated bypass element wherein the bypass element (or bypass layer) is disposed outside the power semiconductor chip. Various embodiments of the invention include a bypass layer or bypass element configured such that an electrical resistance of the bypass element changes in light of one or more conditions, for example electrical or thermal overstress caused by an open contact within a power semiconductor device.

Figure 1A:
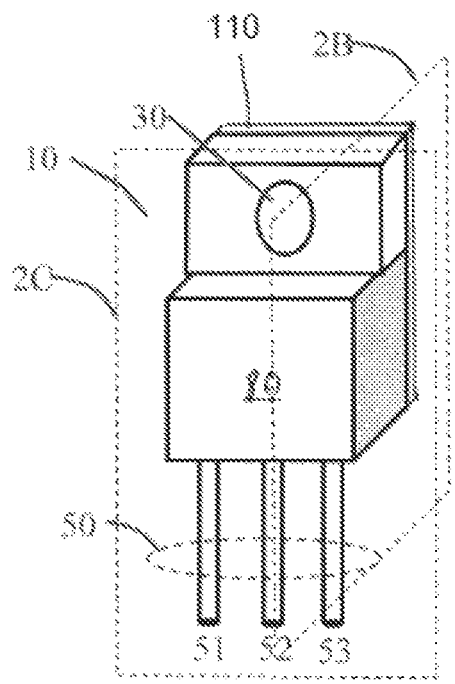
FIG. 1A shows a three dimensional view of a semiconductor device in accordance with an embodiment of the invention.
Figure 1B:
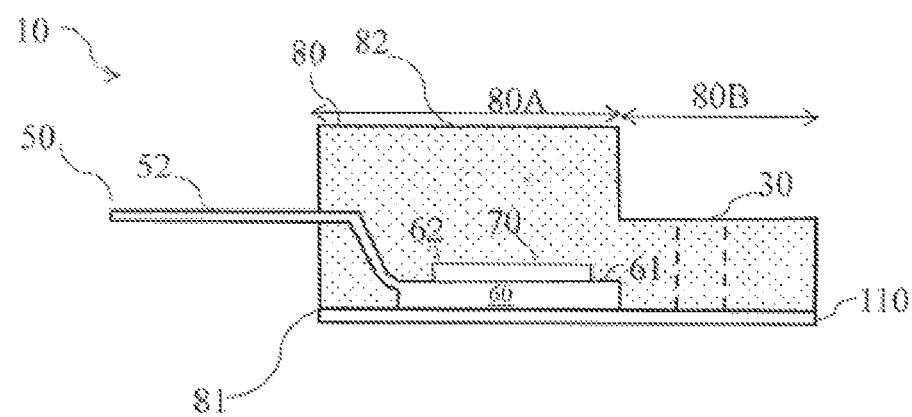
FIG. 1B illustrates a cross-sectional side view of the semiconductor device in accordance with an embodiment of the invention.
Figure 1C:
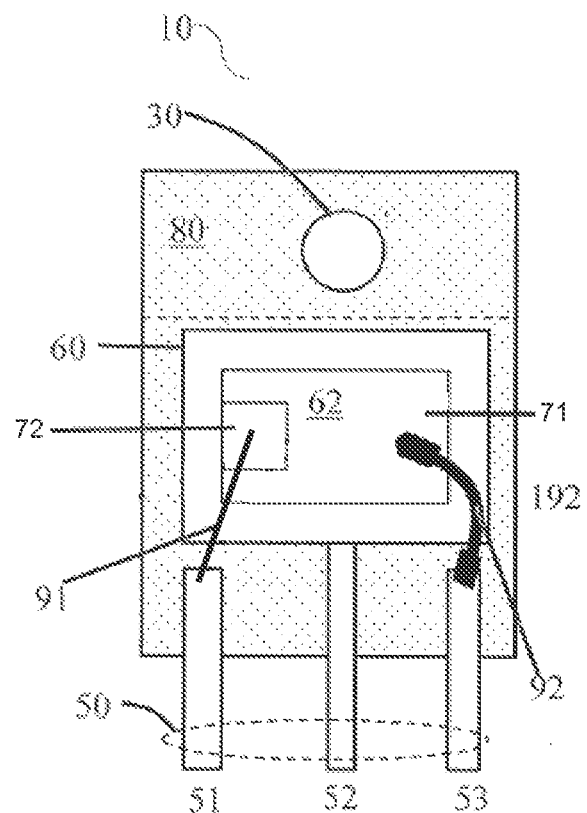
FIG. 1C illustrates a top view of the semiconductor device in accordance with an embodiment of the invention.

FIG. 1A illustrates a three dimensional view, FIG. 1B illustrates a cross-sectional side view and FIG. 1C illustrates a top view of embodiments of a packaged semiconductor device 10 (the top portion of the package being transparent to see the chip).

The packaged semiconductor device 10 includes a package 80 having a plurality of leads or pins 50 extending out of the package 80. The plurality of leads 50 may comprise a number of leads depending on the package type. In one embodiment, the plurality of leads 50 comprises a gate/base lead 51, a drain/collector lead 52, and a source/emitter lead 53. In some embodiments the packaged semiconductor device 10 includes an opening 30 for securely mounting a heatsink underneath the packaged semiconductor device 10.

Referring to FIG. 1B, the packaged semiconductor device 10 comprises a chip carrier 60 such as a leadframe disposed within a package (encapsulant) 80. The leadframe 60 includes the plurality of leads 50. A semiconductor chip 70 is disposed on a die attach or die paddle of the leadframe 60. The leadframe 60 is coupled to a first contact region disposed on a first side 61 of the semiconductor chip 70. The opposite second side 62 of the semiconductor chip 70 is covered with the encapsulant 80.

The encapsulant 80 has a first portion 80A and a second portion 80B. The first portion 80A is directly disposed over the semiconductor chip 70 while the second portion 80B is disposed laterally adjacent the semiconductor chip 70. The second portion 80B is opposite to the direction of the plurality of leads 50 such that the semiconductor chip 70 is disposed between the plurality of leads 50 and the second portion 80B. As illustrated, the first portion 80A is thicker than the second portion 80B. An opening 30 is disposed within the encapsulant 80. The opening 30 is configured to enable mounting of a heatsink. For example, a heatsink (not shown) may be attached to the semiconductor device 10 using a screw mounted through the opening 30.

In some embodiments the first portion 80A and the second portion 80B comprise the same thickness and no opening 30.

Referring again to FIG. 1B, the encapsulant 80 includes a first major surface 81 for the first portion 80A and the second portion 80B, for example, for mounting a heatsink (not shown). The first major surface 81 is planar to maximize heat dissipation from the semiconductor chip 70 to the heatsink. The first portion 80A of the encapsulant 80 includes a second major surface 82 disposed over the second side 62 of the semiconductor chip 70.

In various embodiments, the semiconductor chip 70 may comprise power chips, which, for example, draw large currents (e.g., greater than 30 amperes). For example, the semiconductor chip 70 may be configured to operate at about 20 V to about 1000 V. Alternatively, the semiconductor chip 70 may be configured to operate at about 20 V to about 100 V. In other embodiments, the semiconductor chip 70 may be configured to operate at about 100 V to about 500 V. In one embodiment, the semiconductor chip 70 may be configured to operate at about 500 V to about 1000 V. In yet another embodiment, the semiconductor chip 70 may be configured to operate up to about 10,000 V.

In various embodiments, the semiconductor chip 70 may be a power semiconductor device, which may be a discrete device in one embodiment. In one embodiment, the semiconductor chip 70 is a three terminal device such as a power metal insulator semiconductor field effect transistor (MISFET), a junction field effect transistor (JFET), bipolar junction transistor (BJT), an insulated gate bipolar transistor (IGBT), or a thyristor. Alternatively, the semiconductor chip comprises an integrated circuit (IC).

In one embodiment, the semiconductor chip 70 is an n-channel MISFET. In another embodiment, the semiconductor chip 70 is a p-channel MISFET. In one or more embodiments, the semiconductor chip 70 may comprise a plurality of devices such as a vertical MISFET and a diode, or alternatively two MISFET devices separated by an isolation region.

Embodiments of the invention may be applied to any type of semiconductor devices. As example, embodiments of the invention may be applied to power devices, e.g., having vertical current flow. Due to the large currents flowing through these devices, they generate large amounts of heat that need to be removed quickly to avoid heat buildup, which can impact the performance of these devices negatively.

The thickness of the semiconductor chip 70 from the first side 61 to the second side 62 may be less than 150 µm in some embodiments. The thickness of the semiconductor chip 70 from the first side 61 to the second side 62 may be less than 100 µm in various embodiments. The thickness of the semiconductor chip 70 from the first side 61 to the second side 62 may be less than 50 µm in various embodiments. The thickness of the semiconductor chip 70 from the first side 61 to the second side 62 may be about 50 µm to about 150 µm in some embodiments. The thickness of the semiconductor chip 70 from the first side 61 to the second side 62 may be about 100 µm to about 150 µm in some embodiments. The thickness of the semiconductor chip 70 from the first side 61 to the second side 62 may be about 50 µm to about 100 µm in various embodiments.

As shown in the example of FIG. 1B, semiconductor chip 70 may be disposed on chip carrier 60, which may be configured to secure a position of semiconductor chip 70. As also shown in the example of FIG. 1B, a bypass layer 110 is disposed under the chip carrier (e.g., leadframe) 60. The bypass layer 110 comprises an electrically insulating layer that is configured to become electrically conductive above a predetermined temperature and/or a predetermined electrical stress. In some embodiments an electrical, thermal, or mechanical behavior of the bypass layer 110 may change in light of one or more conditions such as thermal or electrical overstress. For example, the bypass layer 110 is configured to irreversibly change from an insulating layer to a conductive layer in light of one or more conditions. As illustrated, the bypass layer 110 may contact the bottom surface of the leadframe 60.

In one embodiment the bypass layer 110 becomes electrically conductive at or above temperatures of about 150 degrees Celsius (° C.), at or above temperatures of about 250° C., at or above temperatures of about 300° C. or at or above temperatures of about 400° C. Alternatively, the bypass layer 110 becomes electrically conductive at temperatures between about 150° C. and 250° C. or 300° C. and 400° C. In other embodiment the bypass layer 110 becomes electrically conductive at electrical field strengths above about 10 kilovolt per millimeter (kV/mm), above about 50 kV/mm, or above about 100 kV/mm. Alternatively, the bypass layer 110 becomes electrically conductive at electrical field strengths between about 10 kV/mm and about 50 kV/mm, between about 50 kV/mm and about 100 kV/mm, between about 40 kV/mm and about 60 kV/mm, or between about 25 kV/mm and about 75 kV/mm.

The bypass layer 110 may comprise any type of insulating material that becomes conductive above a certain temperature or a certain electrical field stress. In one embodiment they bypass layer 110 becomes conductive and remains conductive above a certain temperature or a certain electrical filed stress.

In one embodiment the bypass layer 110 comprises an organic material layer (or organic layer). For example, the organic layer 110 comprises an imide material or an epoxy material. Alternatively, the organic layer 110 comprises a thermoset material, e.g., a polymer material that irreversibly cures. For example, the organic layer comprises organic structures that align at or above a certain temperature or electrical field stress such that the insulating organic layer becomes conductive.

In one embodiment the bypass layer 110 comprises an insulating layer comprising a conductive filling. The insulating layer may be a dielectric layer or an organic layer. The conductive filling may comprise aluminum (Al), copper (Cu) or carbon based materials. Examples of carbon based materials may include materials fabricated using polyacetylene, ethylenedioxythiophene, carbon nanotubes, graphene, and others.

In one embodiment the bypass layer 110 comprises a material layer comprising two or more materials that are non-conductive below a certain temperature or electrical field strength. However, the two or more materials combine/react and become conductive at or above a certain temperature and/or certain electrical field strength.

In one embodiment the bypass layer 110 may comprise a thickness of about 50 µm and 500 µm. Alternatively, the bypass layer 110 may comprise a thickness of 50 µm and 100 µm, a thickness of 100 µm to 200 µm or a thickness of 200 µm and 500 µm.

Referring to FIG. 1C, the semiconductor chip 70 is disposed over a die paddle of a leadframe 60. The first side 61 (bottom side, not shown in this Figure) of the semiconductor chip 70 is in contact with the leadframe 60. A first contact region on the first side 61 is in contact with the leadframe and the lead 52. The second side 62 of the semiconductor chip 70 comprises a second contact region 71 and a third contact region 72. The second contact region 71 is in contact with the lead 53 and the third contact region 72 is in contact with the lead 51. In one or more embodiments, the first contact region is coupled to the drain region and the second contact region 71 is coupled to the source region of the semiconductor chip 70. Alternatively, the first contact region is coupled to the source region and the second contact region 71 is coupled to the drain region of the semiconductor chip 70. In yet other embodiments, the first contact region is coupled to an emitter region of a transistor and the second contact region 71 is coupled to a collector region of the transistor. Alternatively, the first contact region is coupled to a collector region of a transistor and the second contact region 71 is coupled to an emitter region of the transistor. In one or more embodiments, the third contact region 72 is coupled to a gate or base of a transistor.

A first interconnect 91 couples the third contact region 72, which is coupled to a gate/base region, to a first gate/base lead 51. A second interconnect 92 couples the second contact region 71, which is coupled to a source/emitter region, to a first source/emitter lead 53. Because of the larger currents drawn through the first source/emitter lead 53, the second interconnect 92 may comprise a thicker wire relative to the first interconnect 91 in some embodiments. A first drain/collector lead 52 is coupled to the semiconductor chip 70 through the die paddle of the leadframe 60. Thus, in one embodiment, the semiconductor device 10 has the first gate/base lead 51, the first drain/collector lead 52, followed by the first source/emitter lead 53.

Figure 1D:
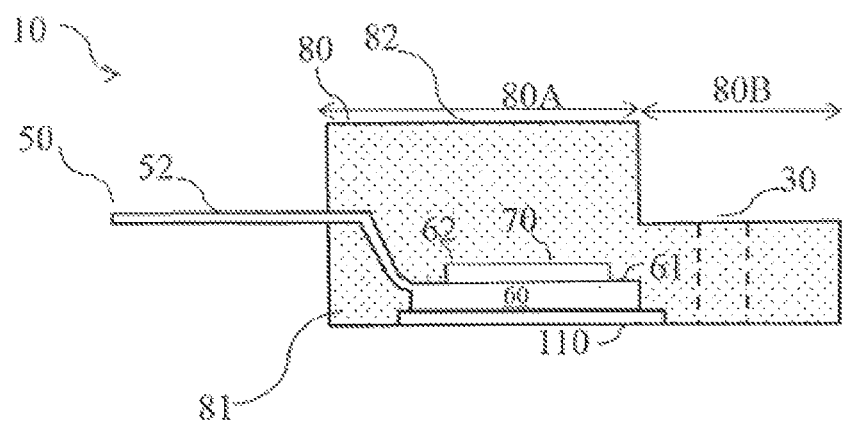
FIG. 1D shows a cross-section side view of a semiconductor device in accordance with another embodiment of the invention.

FIG. 1D illustrates a cross-sectional view of the semiconductor device 10 in which the bypass layer 110 is disposed within the encapsulant 80 in accordance with embodiments of the invention. The bypass layer 110 covers the exposed bottom surface of the leadframe 60 but does not extend completely under the first major surface 81. Accordingly, in this embodiment, the bypass layer 110 is disposed within the encapsulant 80.

Figure 1E:
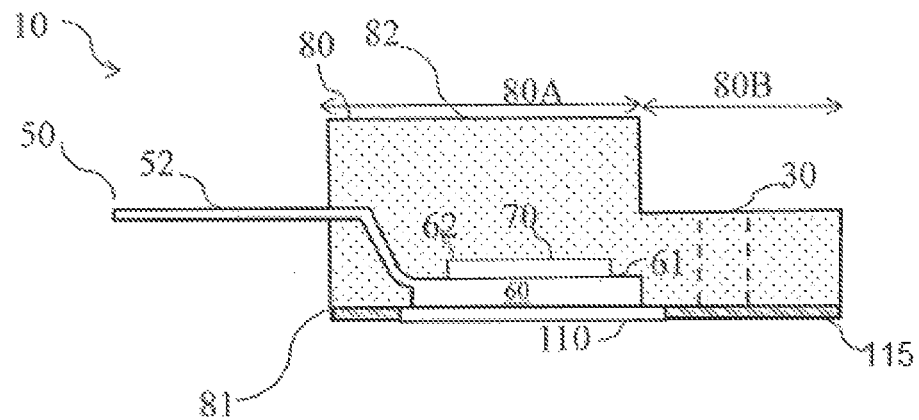
FIG. 1E shows a cross-section side view of a semiconductor device in accordance with yet another embodiment of the invention.

FIG. 1E illustrates a cross-sectional view of the semiconductor device 10 in which the bypass layer 110 is disposed within an auxiliary insulating layer 115 in accordance with embodiments of the invention. The insulating layer 115 may be formed after forming the encapsulant 80. The insulating layer 115 may comprise a suitable dielectric material such as an oxide, nitride, or an encapsulant material.

Figure 2:
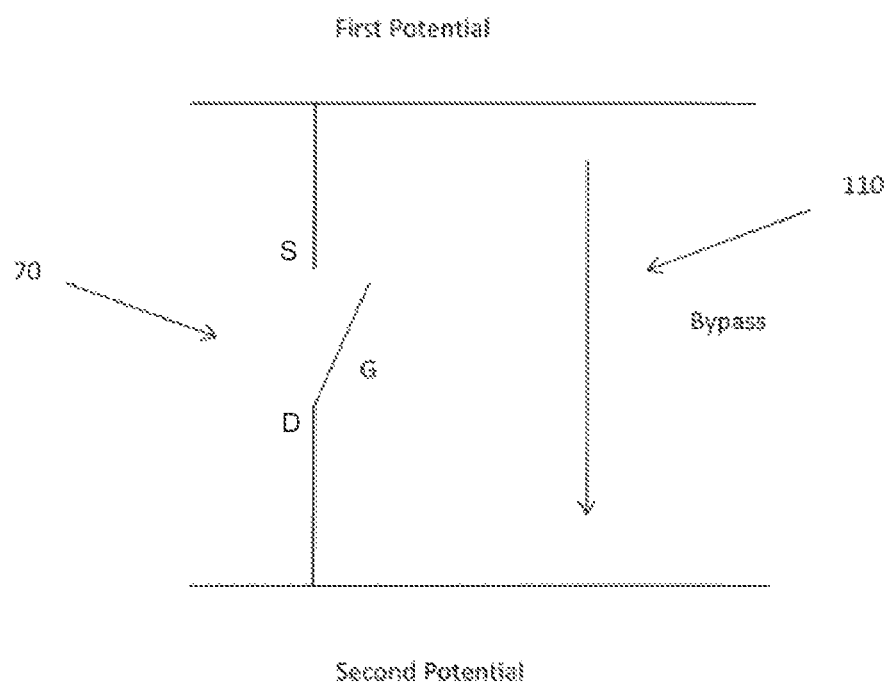
FIG. 2 illustrates a schematic of electrical equivalent circuit diagram of a semiconductor device in accordance with an embodiment of the invention.

FIG. 2 illustrates a schematic of an electrical equivalent circuit diagram of semiconductor devices in accordance with embodiments of the invention. FIG. 2 illustrates an embodiment of the invention in which a bypass layer 110 is attached to a transistor 70. The transistor 70 has a control node G, a drain node D, and a source node S. The source node S is coupled to a first potential node and the drain node D is coupled to a second potential node. In one embodiment the first optional V1 is a high potential and the second potential V2 is a low potential. Alternatively, the first potential V1 is the low potential and the second potential V2 is the high potential. As illustrated in one embodiment, the bypass layer 110 is attached in parallel to the transistor 70. A first node of the bypass layer 110 is coupled to the first potential V1 while a second node of the bypass layer 110 is coupled to second potential V2. During normal mode of operation, a current may flow or frequently flows between the drain node D and the source node S of the transistor 70 and the bypass layer 110 is electrically insulating. If the transistor 70 fails an overstress mode may occur and the current is diverted away from the transistor 70, e.g., flows through the bypass layer 110. In various embodiments the current is shunted to ground during an overstress mode.

In various embodiments, the gate node is pulled up (ON state in an n-channel transistor), which renders the transistor 70 conducting. As the transistor 70 begins to conduct, the current flows through the transistor 70 because the bypass layer's 110 high resistivity.

When the transistor 70 fails, heat is building up within the transistor 70 and as of a certain temperature or electrical field strength the bypass layer 110 becomes electrically conductive and the resistivity decreases substantially. When the bypass layer 110 becomes conductive, the current flows through the bypass layer 110 (e.g., the bypass layer 110 shorts the transistor 70) and/or thermal energy is removed from the transistor 70.

In various embodiments, the bypass layer 110 is configured to become conductive when a positive potential difference above a threshold voltage is applied. In alternative embodiments, the bypass layer 110 is configured to conduct when a potential difference below a threshold voltage is applied.

In various embodiments, the transistor 70 may comprise power metal insulator semiconductor field effect transistors (MISFETs) or power insulated gate bipolar transistors (IGBTs).

Such power MISFETs or power IGBTs may have varying dielectric strengths depending on the respective embodiment. For example, the dielectric strengths may vary from a few 10 V/mm up to a few 100 V/mm. The dielectric strength is a maximum voltage across the source node to the drain node (the load path) that the transistor 70 is able to withstand without breakdown in the OFF state. Power MISFETs and power IGBTs may be n-conducting and p-conducting transistors in various embodiments.

Figure 3A:
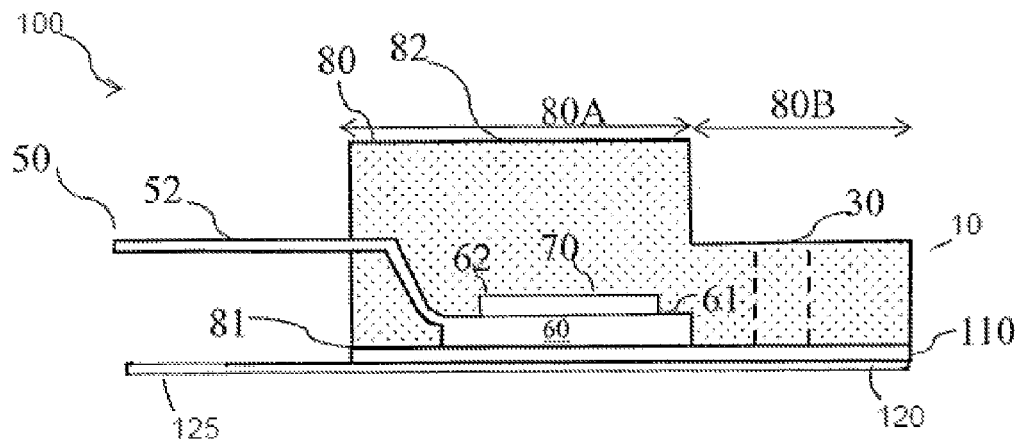
FIG. 3A shows a cross-section side view of a semiconductor device and an electrical connection in accordance with an embodiment of the invention.

FIG. 3A shows an embodiment of a system 100. The system 100 comprises the packaged semiconductor device 10 and a conductive connection 120. The packaged semiconductor device 10 may be the same as described with respect to FIGS. 1A-1C.

The conductive connection 120 may comprise a metal such as aluminum (Al) or copper (Cu). The conductive connection 120 may comprise a thickness of about 0.1 mm to about 10 mm or about 1 mm to about 2 mm.

The conductive connection 120 is disposed underneath the packaged semiconductor device 10. In one embodiment the conductive connection 120 is disposed underneath the bypass layer 110. In particular the conductive connection 120 is disposed directly underneath the bypass layer 110. The conductive connection 120 may comprise a lead 125. For example, the system 100 may comprise a plurality of four (4) leads 50 such as leads 51-53 and lead 125. In some embodiments the lead 125 is configured to be connected to a source terminal or a drain terminal.

In some embodiment the system 100 comprises the configuration described with respect to FIGS. 1D and 1E.

Figure 3B:
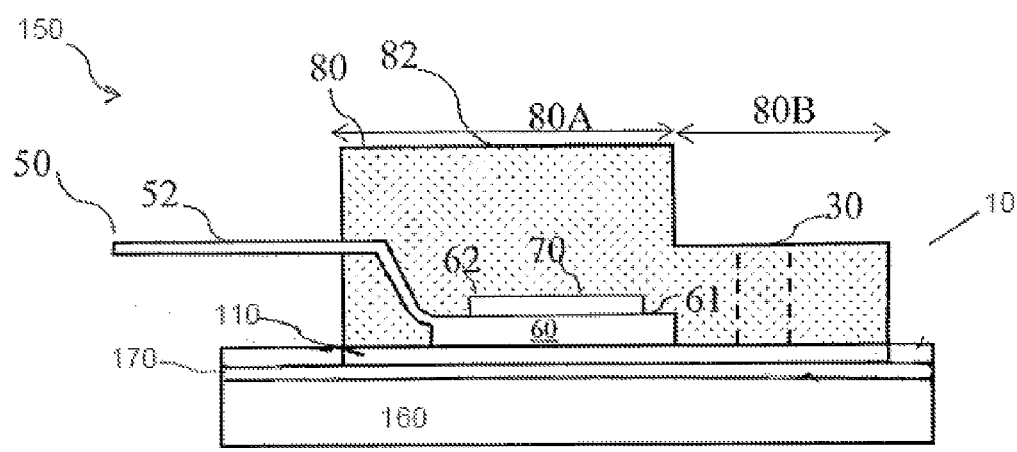
FIG. 3B shows a cross-section side view of a semiconductor device and an electrical connection in accordance with another embodiment of the invention.

FIG. 3B shows a further embodiment of a system 150. The system 150 comprises the packaged semiconductor device 10, a device carrier 160 and a conductive connection 170. The packaged semiconductor device 10 may be the same as described with respect to FIGS. 1A-1C.

The device carrier 160 may be a substrate or a printed circuit board (PCB). The device carrier 160 may comprise a thickness of about 0.1 mm to about 10 mm or about 1 mm to about 2 mm. The conductive connection 170 comprises a metal such as aluminum (Al) or copper (Cu). The conductive connection 170 may comprise a thickness of about 50 µm to about 500 µm or about 100 µm to about 200 µm.

The packaged semiconductor device 10 is disposed on the device carrier (e.g., PCB) 160. The packaged semiconductor device 10 is disposed on the device carrier 160 such that the bypass layer 110 is abutting the conductive connection 170 in the device carrier 160. In some embodiments the conductive connection 170 is connected to the source terminal or the drain terminal.

In various embodiments the packaged semiconductor device 10 and the bypass layer 110 are glued, adhered or taped, and the leads are soldered to the device carrier 160. In some embodiment the system 150 comprises the configuration described with respect to FIGS. 1D and 1E.

Figure 4A:
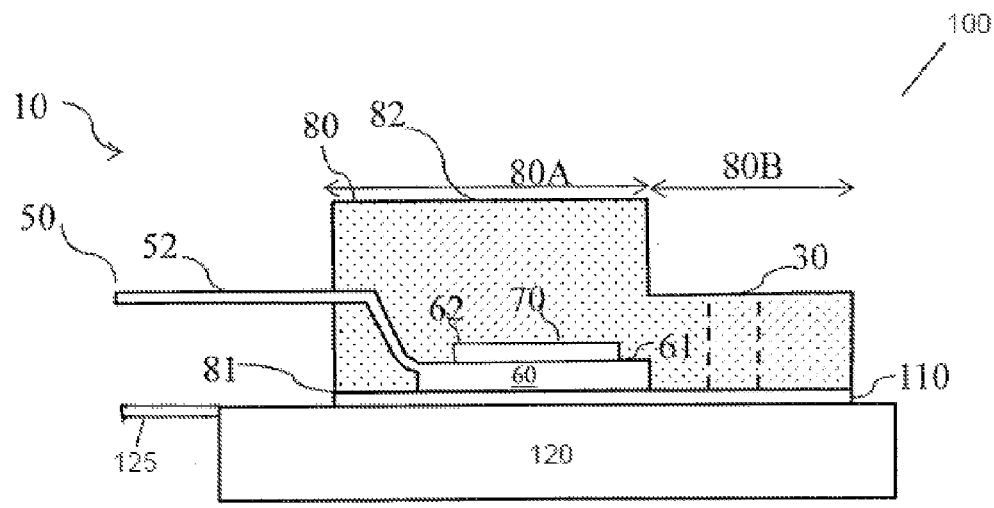
FIG. 4A shows a cross-section side view of a semiconductor device and a heatsink in accordance with an embodiment of the invention.

FIG. 4A shows an embodiment of a system 200. The system 200 comprises the packaged semiconductor device 10 and a heatsink 120. The packaged semiconductor device 10 may be the same as described with respect to FIGS. 1A-1C.

The heatsink 120 may comprise a thermally and electrically conductive plate such as a metal plate. The metal plate comprises a metal such as aluminum (Al) or copper (Cu). The metal plate may comprise a thickness of about 0.1 mm to about 10 mm or about 1 mm to about 2 mm.

The heatsink 120 may be disposed underneath the packaged semiconductor device 10. In one embodiment the heatsink 120 is disposed underneath the bypass layer 110. In particular the heatsink 120 is disposed directly underneath the bypass layer 110. The heatsink 120 is mechanically fixed to the packaged semiconductor device 10 through the opening 30. For example, the heatsink may be attached to the packaged semiconductor device 10 with a screw mounted through the opening 30. In some embodiments the heatsink 120 is configured to be connected to the source terminal or the drain terminal.

The heatsink 120 may comprise a lead 125. For example, the system 100 may comprise a plurality of four (4) leads 50 such as leads 51-53 and lead 125. In some embodiment the system 100 comprises the configuration described with respect to FIGS. 1D and 1E.

Figure 4B:
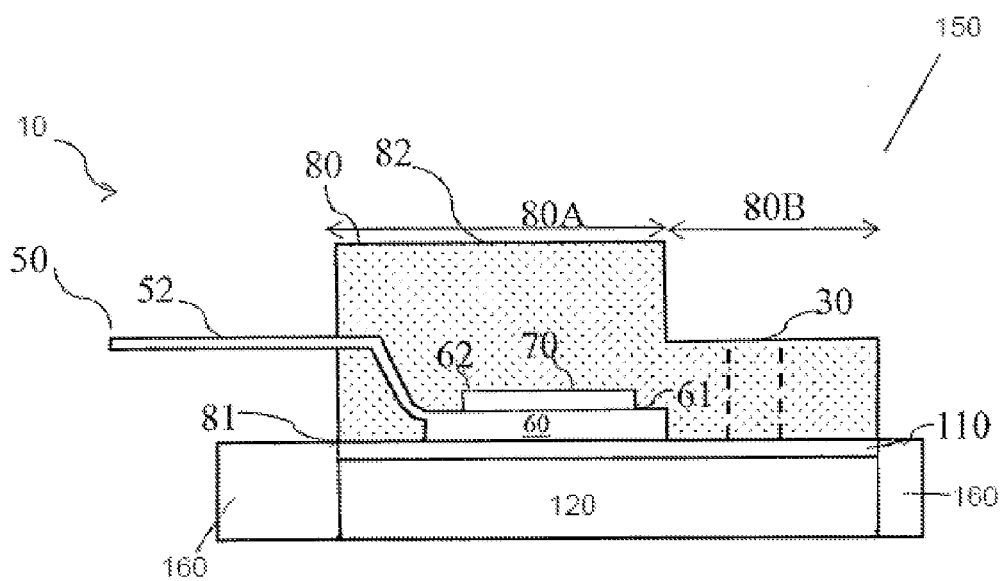
FIG. 4B shows a cross-section side view of a semiconductor device and a heatsink in accordance with an embodiment of the invention.

FIG. 4B shows a further embodiment of a system 150. The system 150 comprises the packaged semiconductor device 10, a device carrier 160 and a heatsink 120. The packaged semiconductor device 10 may be the same as described with respect to FIGS. 1A-1C.

The device carrier 160 may be a substrate or a printed circuit board (PCB). The device carrier 160 may comprise a thickness of about 0.1 mm to about 10 mm or about 1 mm to about 2 mm. The heatsink 120 may comprise a thermally and electrically conductive plate such as a metal plate. The metal plate comprises a metal such as aluminum (Al) or copper (Cu). The metal plate may comprise a thickness of about 50 µm to about 500 µm or about 100 µm to about 200 µm.

The packaged semiconductor device 10 is disposed on the device carrier (e.g., PCB) 160. The packaged semiconductor device 10 is disposed on the device carrier 160 such that bypass layer 110 is abutting a thermally and electrically conductive layer in the device carrier 160. The device carrier 160 is arranged such that the heatsink 120 is abutting the bypass layer 110. Alternatively, the heatsink 120 is integrated in the carrier 160. In some embodiment a conductive connection is disposed between the bypass layer 110 and the heatsink 120 (not shown). In some embodiments the conductive connection or the heatsink 120 is connected to the source terminal or the drain terminal.

The packaged semiconductor device 10 and the bypass layer 110 are glued, adhered or taped and the leads are soldered to the device carrier 160. The heatsink 120 maybe soldered or diffused to the metal layer in the device carrier 160. In some embodiment the system 150 comprises the configuration described with respect to FIGS. 1D and 1E.

Figure 5:
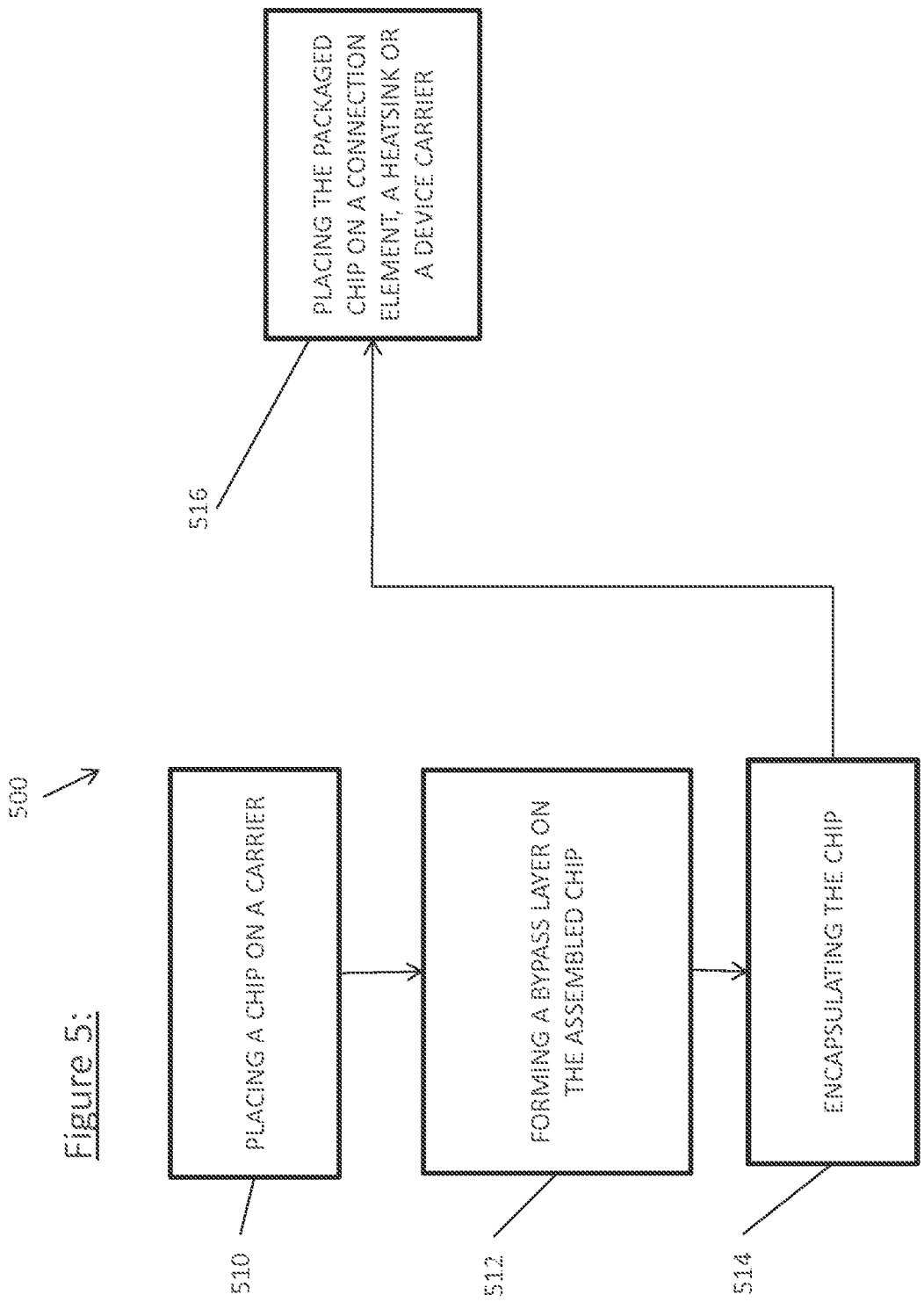
FIG. 5 shows an embodiment of method of manufacturing a semiconductor device in accordance with an embodiment of the invention.

FIG. 5 shows an embodiment of a flow chart 500 of a method for manufacturing a packaged semiconductor device. In step 510 a chip is placed on a chip carrier forming an assembled chip. The chip may be a power semiconductor chip. In one embodiment, the semiconductor chip is a three terminal device such as a power metal insulator semiconductor field effect transistor (MISFET), a junction field effect transistor (JFET), bipolar junction transistor (BJT), an insulated gate bipolar transistor (IGBT), or a thyristor. Alternatively, the semiconductor chip comprises an integrated circuit (IC). In one embodiment, the semiconductor chip is an n-channel MISFET. In another embodiment, the semiconductor chip is a p-channel MISFET. In one or more embodiments, the semiconductor chip comprises a plurality of devices such as a vertical MISFET and a diode, or alternatively two MISFET devices separated by an isolation region.

The chip carrier may be a leadframe. The leadframe may comprise copper (Cu) or nickel. Alternatively, the chip carrier may be a support substrate such as a printed circuit board type substrate.

The chip may be attached to the chip carrier via a soft solder contact or a diffusion solder contact. Alternatively, the chip may be attached to the chip carrier via a conductive adhesive or a conductive foil.

In step 512 a bypass layer is formed on the assembled chip. The bypass layer may be an electrically insulating layer that becomes electrically conductive at a predetermined temperature or at a predetermined stress. Material details are described with respect to FIGS. 1A-1E. The bypass layer may be formed on the assembled chip by laminating, printing or (spray) coating.

In various embodiments the chip is disposed to a first surface of a chip carrier and the bypass layer is disposed on a second surface of the chip carrier.

In step 514 the chip is encapsulated with an encapsulant. Alternatively, the chip and the chip carrier are at least partially encapsulated. The encapsulant or encapsulation material may comprise a molting compound, a ceramic, or laminate. In one embodiment the bypass layer is formed on the assembled chip before the chip is encapsulated. Alternatively, the bypass layer is formed on the encapsulated (packaged) chip.

In step 516 a connection element is disposed on the bypass layer. Alternatively, the packaged chip is disposed on the connection element. The connection element may be a lead, a heatsink with a lead, a conductive trace in a device carrier or a heatsink in a device carrier. Embodiments are described with respect to FIGS. 3A-4B.

The packaged chip (including the bypass layer) is glued or adhered to the connection element. Alternatively, the packaged chip is mounted on the connection element applying connection means such as a screw, for example.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a chip carrier comprising a portion configured to provide an external contact for the device;
   a semiconductor chip disposed on a first surface of the chip carrier; and
   a bypass layer disposed on a second surface of the chip carrier, the first surface being opposite to the second surface, wherein bypass layer is configured to change from being an insulator to being a conductor in response to a condition of the semiconductor chip.

2. The device according to claim 1, wherein the condition of the semiconductor chip comprises a condition selected from the group consisting of a temperature of the semiconductor chip and an electrical field strength of the semiconductor chip.

3. The device according to claim 2, wherein the condition of the semiconductor chip comprises the temperature of the semiconductor chip that is above 150 degrees Celsius.

4. The device according to claim 2, wherein the condition of the semiconductor chip comprises the electrical field strength of the semiconductor chip that is above 10 kilovolt per millimeter (KV/mm).

5. The device according to claim 1, wherein the bypass layer changes from being the insulator to being the conductor to divert electrical energy from a contact region of the semiconductor chip away from the semiconductor chip to protect the semiconductor chip from damage.

6. The device according to claim 1, wherein the bypass layer comprises an organic material layer.

7. The device according to claim 6, wherein the organic material layer comprises a metal filling.

8. The device according to claim 6, wherein the organic material layer comprises a material selected from the group consisting of an imide material, an epoxy material and a thermoset material.

9. A device comprising:
   a leadframe;
   a chip disposed on a first surface of the leadframe; and
   a bypass layer disposed on a second surface of the leadframe so that the leadframe is located between the bypass layer and the chip, wherein the bypass layer is configured to change from being an insulator to being a conductor in response to a condition of the chip.

10. The device according to claim 9, wherein the condition of the chip comprises a condition selected from the group consisting of a temperature of the chip and an electrical field strength of the chip.

11. The device according to claim 10, wherein the condition of the chip comprises the temperature of the chip that is above 150 degrees Celsius.

12. The device according to claim 10, wherein the condition of the chip comprises the electrical field strength of the chip that is above 10 kilovolt per millimeter (KV/mm).

13. The device according to claim 9, wherein the chip comprises a first contact region coupled to a first lead of the leadframe and a second contact region coupled to a second lead of the leadframe, and wherein a third contact region and the bypass layer are coupled to a third lead of the leadframe.

14. The device according to claim 9, wherein the chip is a vertical power chip, wherein the vertical power chip is configured to conduct a current between a first chip contact and a second chip contact based upon a signal applied to a control contact, wherein the first chip contact is electrically connected to a first lead of the leadframe, the control contact is electrically connected to a second lead of the leadframe, and wherein the second chip contact is electrically connected to a third lead of the leadframe and to the bypass layer.

15. The device according to claim 9, wherein the bypass layer comprises an organic material layer.

16. The device according to claim 15, wherein the organic material layer comprises a metal filling.

17. The device according to claim 15, wherein the organic material layer comprises a material selected from the group consisting of an imide material, an epoxy material and a thermoset material.

18. A power MOSFET device comprising:
- a power MOSFET chip comprising a source terminal at a first surface of the chip, a gate terminal at the first surface of the chip, and a drain terminal at a second surface of the chip, the second surface opposite the first surface;
- a lead having a die pad, a source lead, a gate lead and a drain lead that is electrically coupled to the die pad, wherein the chip is mounted on a first surface of the die pad and wherein the source terminal of the chip is electrically coupled to the source lead, the gate terminal of the chip is electrically coupled to the gate lead and the drain terminal of the chip is electrically coupled to the drain lead; and
- a bypass layer disposed on a second surface of the die pad so that the die pad is disposed between the bypass layer and the chip, wherein the bypass layer is configured to change from behaving as an insulator to behaving as a conductor in response to a condition of the chip.

19. A method for manufacturing a semiconductor device, the method comprising:
- electrically coupling a semiconductor chip on a first side of a leadframe; and
- placing a bypass layer on a second side of the leadframe, the bypass layer comprising a material configured to change from being an insulator to being a conductor in response to a condition of the semiconductor chip.

20. The method according to claim 19, wherein the bypass layer comprises an organic material layer.

21. The method according to claim 19, wherein the semiconductor chip comprises a vertical power transistor.

22. The method according to claim 19, wherein electrically coupling the semiconductor chip on the first side of the leadframe comprises electrically coupling a first contact region of the semiconductor chip to a first portion on the first side.

23. The method according to claim 22, further comprising electrically coupling a second contact region of the semiconductor chip to a second portion of the leadframe and a third contact region of the semiconductor chip to a third portion of the leadframe, and wherein the bypass layer is electrically coupled to the first portion of the leadframe.

24. A method for operating a semiconductor device that comprises a semiconductor chip having first and second contact regions and a bypass layer electrically coupled to the first contact region, the method comprising:
- during a normal mode of operation, conducting a current through the semiconductor chip between the first contact region and the second contact region, wherein the bypass layer is electrically insulating during the normal mode of operation; and
- during an overstress mode of operation, conducting the current through the bypass layer away from the semiconductor chip, wherein the bypass layer has a lower resistance during the overstress mode of operation than during the normal mode of operation.

25. The method according to claim 24, wherein the current is shunted to a ground node during the overstress mode of operation.

26. The method according to claim 25, wherein the overstress mode of operation is entered in response to a temperature of the semiconductor chip exceeding a threshold temperature.

27. The method according to claim 26, wherein the threshold temperature is 150 degrees Celsius.

28. The method according to claim 25, wherein the overstress mode of operation is entered in response to an electrical field strength exceeding a threshold field strength.

29. The method according to claim 28, wherein the threshold field strength is 10 kilovolt per millimeter.

* * * * *